United States Patent
Lee et al.

(10) Patent No.: US 10,461,027 B2
(45) Date of Patent: Oct. 29, 2019

(54) SEMICONDUCTOR DEVICE INCLUDING VIA PLUG AND METHOD OF FORMING THE SAME

(71) Applicant: Samsung Electronics Co., Ltd., Suwon-si, Gyeonggi-do (KR)

(72) Inventors: Eui Bok Lee, Hwaseong-si (KR); Jong Min Baek, Hwaseong-si (KR); Sang Hoon Ahn, Hwaseong-si (KR); Hyeok Sang Oh, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/008,319

(22) Filed: Jun. 14, 2018

(65) Prior Publication Data

US 2019/0244896 A1 Aug. 8, 2019

(30) Foreign Application Priority Data

Feb. 7, 2018 (KR) .................. 10-2018-0015029

(51) Int. Cl.
*H01L 23/58* (2006.01)
*H01L 23/522* (2006.01)
*H01L 21/768* (2006.01)
*H01L 21/02* (2006.01)
*H01L 23/532* (2006.01)

(52) U.S. Cl.
CPC ...... *H01L 23/5226* (2013.01); *H01L 21/0228* (2013.01); *H01L 21/02172* (2013.01); *H01L 21/76843* (2013.01); *H01L 23/53223* (2013.01); *H01L 23/53238* (2013.01); *H01L 23/53295* (2013.01)

(58) Field of Classification Search
CPC ......... H01L 21/76832; H01L 21/76802; H01L 23/49894; H01L 23/3192; H01L 23/291
USPC ........................... 257/635, 637, 758
See application file for complete search history.

(56) References Cited

U.S. PATENT DOCUMENTS

| | | | |
|---|---|---|---|
| 5,858,869 A | 1/1999 | Chen et al. | |
| 6,093,632 A | 7/2000 | Lin | |
| 6,180,514 B1 | 1/2001 | Ych et al. | |
| 6,187,672 B1 | 2/2001 | Zhao et al. | |
| 6,373,136 B2 * | 4/2002 | Otsuka | H01L 21/76807 257/758 |
| 6,559,045 B2 | 5/2003 | Chung | |
| 6,994,949 B2 | 2/2006 | Lee et al. | |
| 7,253,099 B2 | 8/2007 | Hwang et al. | |

(Continued)

FOREIGN PATENT DOCUMENTS

| | | |
|---|---|---|
| JP | 2000-232106 A | 8/2000 |
| KR | 2000-0027494 A | 5/2000 |
| KR | 2003-0059473 A | 7/2003 |

*Primary Examiner* — S. V. Clark
(74) *Attorney, Agent, or Firm* — Lee & Morse, P.C.

(57) ABSTRACT

A semiconductor device includes a lower insulating layer disposed on a substrate. A conductive pattern is formed in the lower insulating layer. A middle insulating layer is disposed on the lower insulating layer and the conductive pattern. A via control region is formed in the middle insulating layer. An upper insulating layer is disposed on the middle insulating layer and the via control region. A via plug is formed to pass through the via control region and to be connected to the conductive pattern. The via control region has a lower etch rate than the middle insulating layer.

20 Claims, 16 Drawing Sheets

(56) References Cited

U.S. PATENT DOCUMENTS

| | | | |
|---|---|---|---|
| 7,880,178 B2* | 2/2011 | Koda | H01S 5/0262 |
| | | | 257/82 |
| 8,080,878 B2 | 12/2011 | Ueki et al. | |
| 8,772,938 B2 | 7/2014 | Boyanov et al. | |
| 9,324,650 B2 | 4/2016 | Edelstein et al. | |
| 2012/0256280 A1* | 10/2012 | Erhart | H01L 21/561 |
| | | | 257/414 |
| 2016/0074323 A1* | 3/2016 | Chey | A61K 9/0097 |
| | | | 604/891.1 |
| 2017/0170229 A1* | 6/2017 | Oh | H01L 27/14645 |
| 2018/0025975 A1* | 1/2018 | Chang | H01L 23/5226 |
| | | | 257/774 |

* cited by examiner

SEMICONDUCTOR DEVICE INCLUDING VIA PLUG AND METHOD OF FORMING THE SAME

CROSS-REFERENCE TO RELATED APPLICATION

Korean Patent Application No. 10-2018-0015029, filed on Feb. 7, 2018, in the Korean Intellectual Property Office (KIPO), and entitled: "Semiconductor Device Including Via Plug and Method of Forming the Same," is incorporated by reference herein in its entirety.

BACKGROUND

1. Field

Embodiments relates to a semiconductor device including a via plug and a method of forming the semiconductor device.

2. Discussion of the Related Art

With an increase in the integration density of semiconductor devices, interconnection techniques for electrically connecting a plurality of active/passive elements face various limitations. Multilayered interconnection techniques have been attempted to increase integration efficiency.

SUMMARY

Embodiments are directed to a semiconductor device that includes a lower insulating layer disposed on a substrate, a conductive pattern formed in the lower insulating layer, a middle insulating layer disposed on the lower insulating layer and the conductive pattern, a via control region formed in the middle insulating layer, an upper insulating layer disposed on the middle insulating layer and the via control region, and a via plug configured to pass through the via control region and connected to the conductive pattern. The via control region has a lower etch rate than the middle insulating layer.

Embodiments are also directed to a semiconductor device that includes a lower insulating layer disposed on a substrate, a plurality of conductive patterns formed in the lower insulating layer, a middle insulating layer disposed on the lower insulating layer and the conductive patterns, a plurality of via control regions formed in the middle insulating layer, an upper insulating layer disposed on the middle insulating layer and the via control regions, and a via plug formed between the via control regions and connected to one selected from among the conductive patterns. The via control regions are arranged between the plurality of conductive patterns, and the via control regions have a lower porosity than the middle insulating layer.

Embodiments are also directed to a semiconductor device that includes a lower insulating layer disposed on a substrate, a conductive pattern formed in the lower insulating layer, a middle insulating layer disposed on the lower insulating layer and the conductive pattern, a via control region formed in the middle insulating layer, an upper insulating layer disposed on the middle insulating layer and the via control region, a via plug configured to pass through the via control region and connected to the conductive pattern, an upper interconnection formed in the upper insulating layer and connected to the via plug. The via control region includes a material having a lower etch rate than the middle insulating layer.

Embodiments are also directed to a method of forming a semiconductor device, the method including forming a lower insulating layer on a substrate and forming a conductive pattern in the lower insulating layer. A middle insulating layer is formed on the lower insulating layer and the conductive pattern. A via control region is formed in the middle insulating layer using a selective densification process. An upper insulating layer is formed on the middle insulating layer and the via control region. A via plug is formed to pass through the via control region and to be connected to the conductive pattern. The via control region has a lower etch rate than the middle insulating layer.

BRIEF DESCRIPTION OF THE DRAWINGS

Features will become apparent to those of skill in the art by describing in detail example embodiments with reference to the attached drawings in which.

DETAILED DESCRIPTION

FIGS. 1 to 4 are cross-sectional views of a semiconductor device according to an example embodiment.

Figure 1:
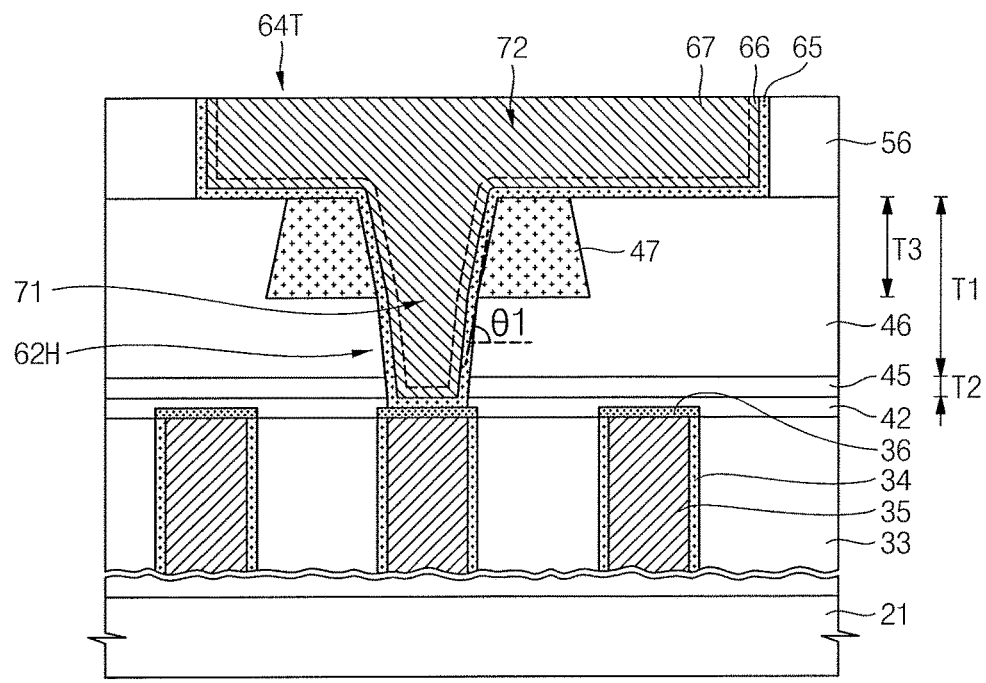
FIGS. 1 to 8 illustrate cross-sectional views of a semiconductor device according to example embodiments.

Referring to FIG. 1, the semiconductor device may include a substrate 21, a lower insulating layer 33, a first barrier metal layer 34, a plurality of conductive patterns 35, a capping layer 36, an etch stop layer 42, a glue layer 45, a middle insulating layer 46, a plurality of via control regions 47, an upper insulating layer 56, a via hole 62H, a trench 64T, a second barrier metal layer 65, a seed layer 66, and an upper conductive layer 67. The second barrier metal layer 65, the seed layer 66, and the upper conductive layer 67 may constitute a via plug 71 inside the via hole 62H and constitute an upper interconnection 72 inside the trench 64T.

The plurality of conductive patterns 35 may be formed to be spaced apart from each other in the lower insulating layer 33. Side surfaces of the plurality of conductive patterns 35 may be surrounded by the first barrier metal layer 34. The capping layer 36 may be formed on the plurality of conductive patterns 35. The etch stop layer 42, the glue layer 45, the middle insulating layer 46, and the upper insulating layer 56 may be sequentially stacked on the lower insulating layer 33 and the capping layer 36.

The plurality of via control regions 47 may be formed in the middle insulating layer 46. Top surfaces of the plurality of via control regions 47 and the middle insulating layer 46 may be substantially coplanar. The plurality of via control regions 47 may be arranged between the plurality of conductive patterns 35. Bottom surfaces of the plurality of via control regions 47 may be formed at a higher level than a bottom surface of the middle insulating layer 46. The middle insulating layer 46 may remain between the plurality of via control regions 47 and the glue layer 45. In an example embodiment, the plurality of via control regions 47 may be arranged above portions between the plurality of conductive patterns 35.

The middle insulating layer 46 may have a first thickness T1. The glue layer 45 may have a second thickness T2. The second thickness T2 may be smaller than the first thickness T1. The plurality of via control regions 47 may exhibit a third thickness T3. The third thickness T3 may be smaller than the first thickness T1. The third thickness T3 may be greater than the second thickness T2. In an example embodiment, the third thickness T3 may range from about 20 nm to about 100 nm. For example, the third thickness T3 of the plurality of via control regions 47 may be about 50 nm.

The middle insulating layer 46 may include a low-k dielectric material. In an example embodiment, the middle insulating layer 46 may include a SiOCH layer formed using a flowable chemical vapor deposition (FCVD) method. The plurality of via control regions 47 may include SiOCH, SiOH, or a combination of components thereof. The plurality of via control regions 47 may have higher "O" (oxygen) content and lower "C" (carbon) content than the middle insulating layer 46. The plurality of via control regions 47 may have an etch selectivity with respect to the middle insulating layer 46. The plurality of via control regions 47 may have a lower etch rate than the middle insulating layer 46. The plurality of via control regions 47 may have a higher hardness than the middle insulating layer 46. The plurality of via control regions 47 may have a lower porosity than the middle insulating layer 46.

In an example embodiment, the middle insulating layer 46 may include a $SiO_xC_yH$ layer. The plurality of via control regions 47 may include a $SiO_mC_nH$ layer. Here, x, y, m, and n may be in relationships of x>0, y>0, m>0, n≥0, x<m, and y>n.

The trench 64T may be formed in the upper insulating layer 56. The via hole 62H may communicate with a bottom surface of the trench 64T. The via hole 62H may pass through a portion between the plurality of via control regions 47 and completely pass through the middle insulating layer 46, the glue layer 45, and the etch stop layer 42. A shape of the via hole 62H may be formed by an etch selectivity between the plurality of via control regions 47 and the middle insulating layer 46. The plurality of via control regions 47 may serve to control a profile of the via hole 62H. The plurality of via control regions 47 may serve to reduce an alignment error of the via hole 62H. The plurality of via control regions 47 may serve to prevent a specific region of the via hole 62H from abnormally expanding. For example, the plurality of via control regions 47 may serve to prevent an upper region of the via hole 62H from abnormally expanding.

A sidewall of the via hole 62H may be inclined. When viewed in the cross-section, the sidewall of the via hole 62H may include a curve or an inflection point. A cross angle θ1 between a tangent line at one point on the sidewall of the via hole 62H and a lateral line parallel to the surface of the substrate 21 may range from 45° to 90°. In an example embodiment, the cross angle θ1 may range from 82° to 88°. For example, the cross angle θ1 may be about 85°. In an example embodiment, the cross angle θ1 may correspond to a chamfer angle.

The upper interconnection 72 may be formed inside the trench 64T. The via plug 71 may be formed inside the via hole 62H. A height of each of the via hole 62H and the via plug 71 may be greater than a lateral width thereof. The via plug 71 may be in continuity with a bottom surface of the upper interconnection 72. The via plug 71 may pass through a portion between the plurality of via control regions 47 and pass through the middle insulating layer 46, the glue layer 45, and the etch stop layer 42 to be in direct contact with the capping layer 36. The via plug 71 may be electrically connected to one selected from among the plurality of conductive patterns 35. A side surface of the via plug 71 may be in direct contact with the plurality of via control regions 47, the middle insulating layer 46, the glue layer 45, and the etch stop layer 42. A shape of the via plug 71 may be formed by the via hole 62H. The plurality of via control regions 47 may serve to control the shape of the via plug 71. A bottom surface of the upper interconnection 72 may be in direct contact with top surfaces of the plurality of via control regions 47 and the middle insulating layer 46.

In an example embodiment, the plurality of via control regions 47 may be connected to each other in the middle insulating layer 46. The via plug 71 may be seen as passing through the via control region 47.

Figure 2:
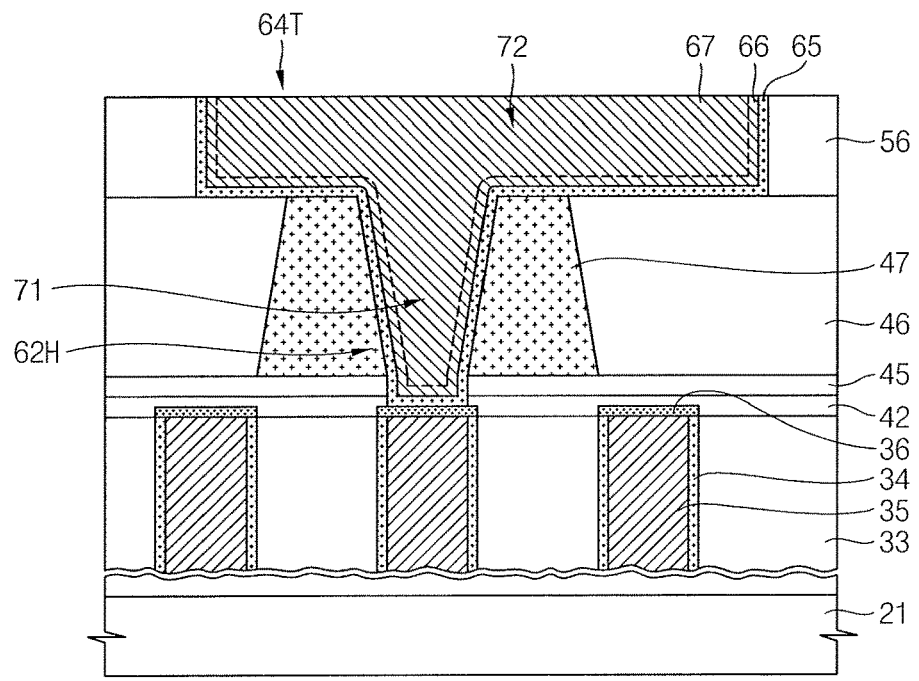

Referring to FIG. 2, the plurality of via control regions 47 may have substantially the same thickness as that of the middle insulating layer 46. The bottom surfaces of the plurality of via control regions 47 may be in contact with the glue layer 45. Bottom surfaces of the plurality of via control regions 47 and the middle insulating layer 46 may be substantially coplanar. The via hole 62H may pass through the portion between the plurality of via control regions 47 and completely pass through the glue layer 45 and the etch stop layer 42. The via plug 71 may pass through the portion between the plurality of via control regions 47 and pass through the glue layer 45 and the etch stop layer 42 to be in direct contact with the capping layer 36. The side surface of the via plug 71 may be in direct contact with the plurality of via control regions 47, the glue layer 45, and the etch stop layer 42.

In an example embodiment, the glue layer 45 may be omitted. The bottom surfaces of the plurality of via control regions 47 may be in contact with the etch stop layer 42.

Figure 3:
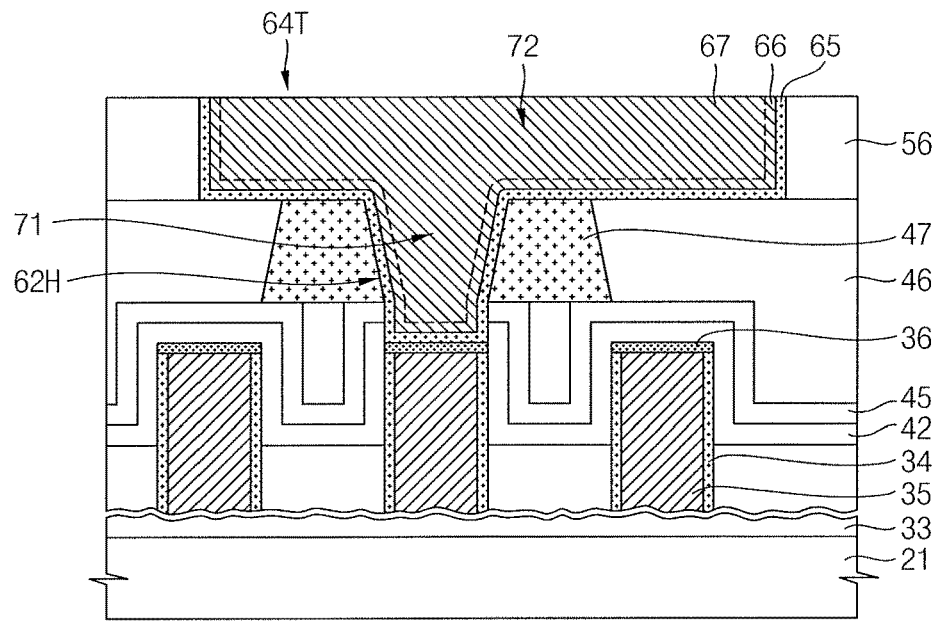

Referring to FIG. 3, the lower insulating layer 33 may be formed at a lower level than top ends of the first barrier metal layer 34 and the plurality of conductive patterns 35. The first barrier metal layer 34 and the plurality of conductive patterns 35 may protrude to a higher level than a top surface of the lower insulating layer 33. A bottom end of the middle insulating layer 46 may be formed at a lower level than top ends of the plurality of conductive patterns 35. The middle insulating layer 46 may be disposed beside side surfaces of the plurality of conductive patterns 35. Bottom surfaces of the plurality of via control regions 47 may be in contact with the glue layer 45 and the middle insulating layer 46. The via hole 62H may pass through the portion between the plurality of via control regions 47 and completely pass through the glue layer 45 and the etch stop layer 42. The via plug 71 may pass through the portion between the plurality of via control regions 47 and pass through the glue layer 45 and the etch stop layer 42 to be in direct contact with the capping layer 36. The side surface of the via plug 71 may be in direct contact with the plurality of via control regions 47, the glue layer 45, and the etch stop layer 42.

Figure 4:
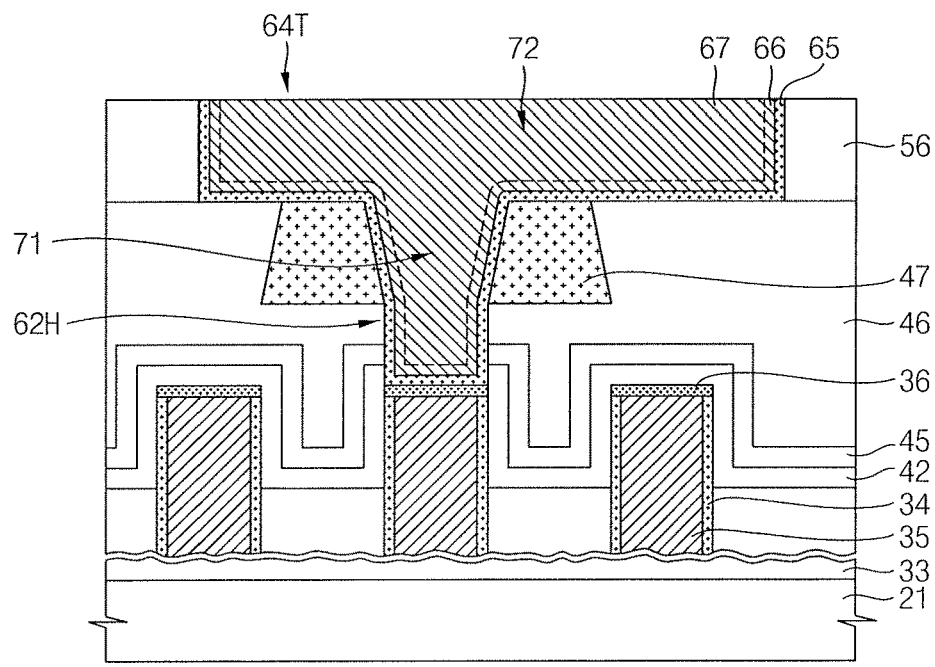

Referring to FIG. 4, the bottom surfaces of the plurality of via control regions 47 may be formed at a higher level than a top end of the glue layer 45. The bottom surfaces of the plurality of via control regions 47 may be in direct contact with the middle insulating layer 46. The via hole 62H may pass through the portion between the plurality of via control regions 47 and completely pass through the middle insulating layer 46, the glue layer 45, and the etch stop layer 42. The via plug 71 may pass through the portion between the plurality of via control regions 47 and pass through the middle insulating layer 46, the glue layer 45, and the etch stop layer 42 to be in direct contact with the capping layer 36. The side surface of the via plug 71 may be in direct contact with the plurality of via control regions 47, the middle insulating layer 46, the glue layer 45, and the etch stop layer 42.

FIGS. 5 to 8 are cross-sectional views of a semiconductor device according to an example embodiment.

Figure 5:
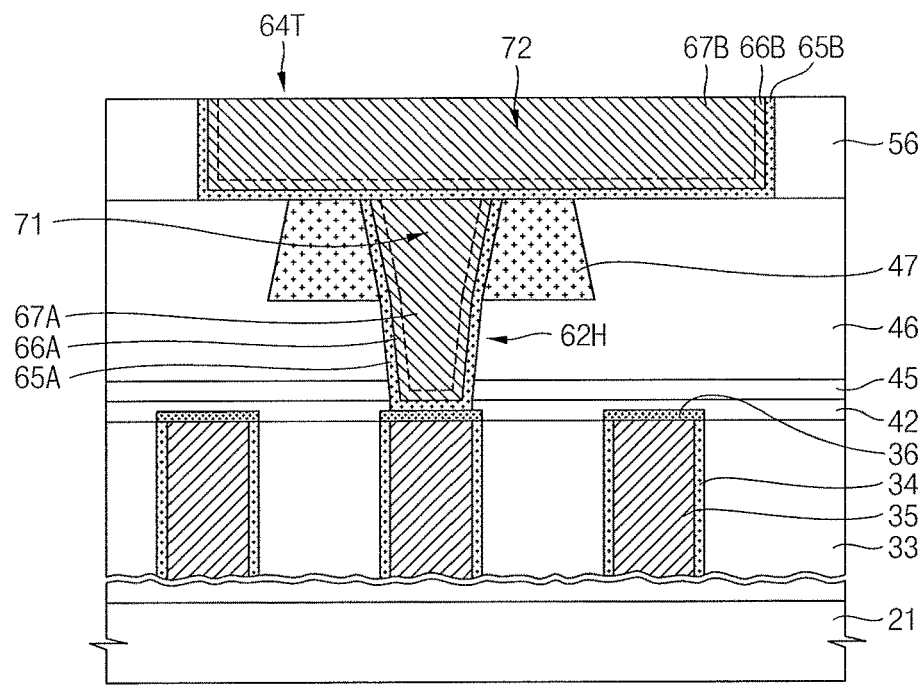

Referring to FIG. 5, a via barrier metal layer 65A, a via seed layer 66A, and a via conductive layer 67A may be formed inside a via hole 62H. The via barrier metal layer 65A, the via seed layer 66A, and the via conductive layer 67A may constitute a via plug 71. Top surfaces of the via plug 71, a plurality of via control regions 47, and a middle insulating layer 46 may be substantially coplanar. An upper insulating layer 56 may be formed on the middle insulating layer 46, the plurality of via control regions 47, and the via plug 71. A trench 64T may be formed in the upper insulating layer 56. An upper barrier metal layer 65B, an upper seed layer 66B, and an upper conductive layer 67B may be formed in the trench 64T. The upper barrier metal layer 65B, the upper seed layer 66B, and the upper conductive layer 67B may constitute an upper interconnection 72. The upper interconnection 72 may be in contact with the via plug 71. The upper barrier metal layer 65B may be in direct contact with top surfaces of the via barrier metal layer 65A, the via seed layer 66A, and the via conductive layer 67A.

Figure 6:
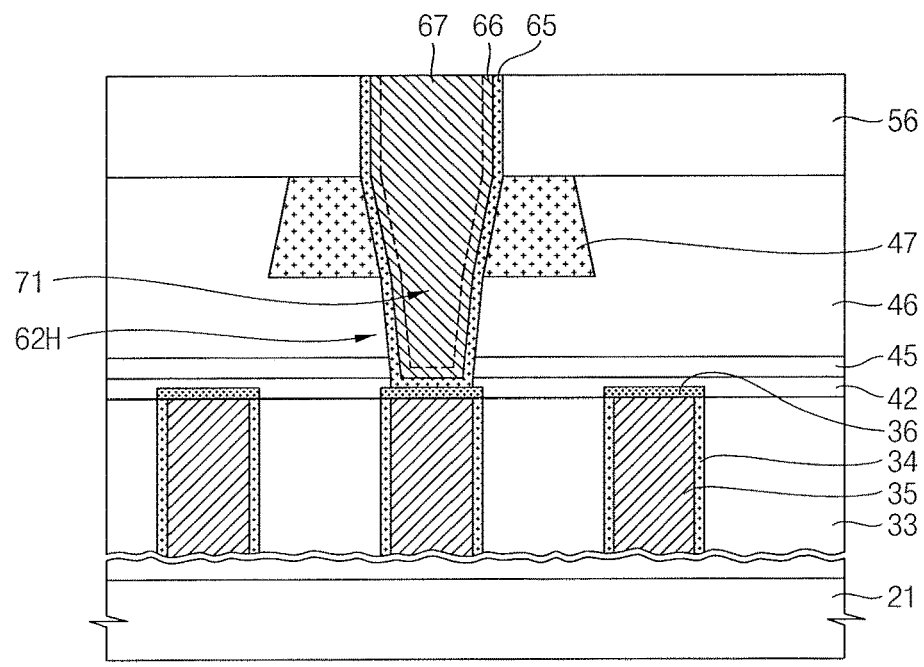

Referring to FIG. 6, the via hole 62H may pass through the upper insulating layer 56, pass through a portion between the plurality of via control regions 47, completely pass through the middle insulating layer 46, pass through a glue layer 45, and pass through an etch stop layer 42. A second barrier metal layer 65, a seed layer 66, and an upper conductive layer 67 may be formed in the via hole 62H. The second barrier metal layer 65, the seed layer 66, and the upper conductive layer 67 may constitute the via plug 71. The via plug 71 may be in contact with a capping layer 36. A side surface of the via plug 71 may be in direct contact with the upper insulating layer 56, the plurality of via control regions 47, the middle insulating layer 46, the glue layer 45, and the etch stop layer 42.

Figure 7:
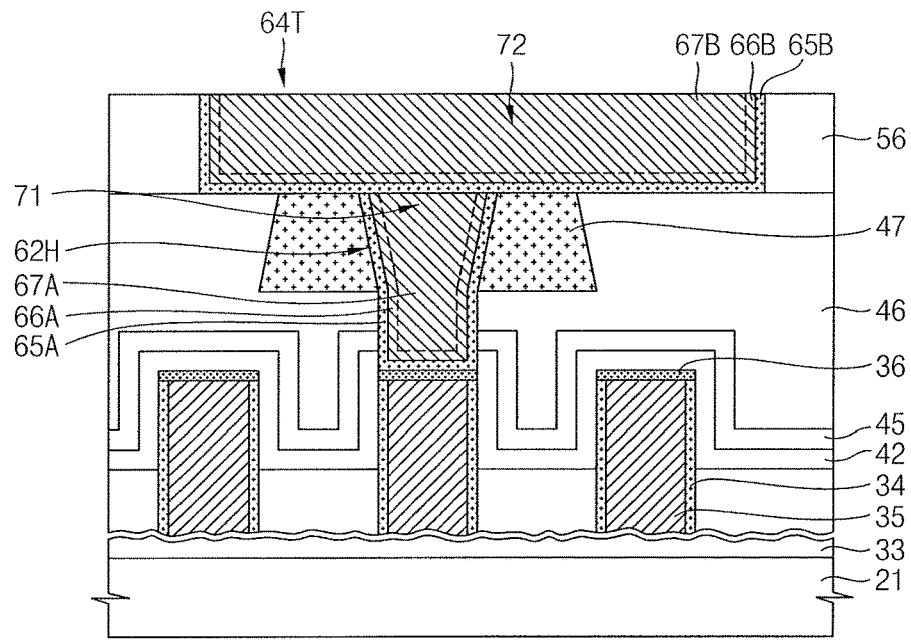

Referring to FIG. 7, a lower insulating layer 33 may be formed at a lower level than top ends of a first barrier metal layer 34 and a plurality of conductive patterns 35. The first barrier metal layer 34 and the plurality of conductive patterns 35 may protrude to a higher level than a top surface of the lower insulating layer 33. A via barrier metal layer 65A, a via seed layer 66A, and a via conductive layer 67A may be formed inside the via hole 62H. The via barrier metal layer 65A, the via seed layer 66A, and the via conductive layer 67A may constitute the via plug 71. Top surfaces of the via plug 71, the plurality of via control regions 47, and the middle insulating layer 46 may be substantially coplanar.

Figure 8:
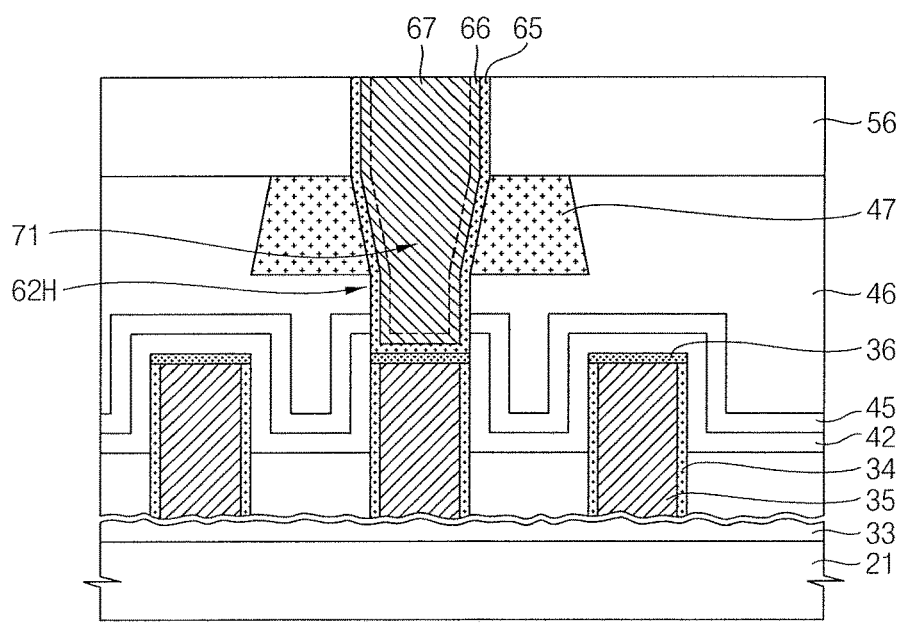

Referring to FIG. 8, the lower insulating layer 33 may be formed at a lower level than top ends of the first barrier metal layer 34 and the plurality of conductive patterns 35. The first barrier metal layer 34 and the plurality of conductive patterns 35 may protrude to a higher level than the top surface of the lower insulating layer 33. The via hole 62H may pass through the upper insulating layer 56, pass through the portion between the plurality of via control regions 47, completely pass through the middle insulating layer 46, pass through the glue layer 45, and pass through the etch stop layer 42. A second barrier metal layer 65, a seed layer 66, and an upper conductive layer 67 may be formed inside the via hole 62H. The second barrier metal layer 65, the seed layer 66, and the upper conductive layer 67 may constitute the via plug 71. The via plug 71 may be in contact with the capping layer 36.

FIGS. 9 to 19 illustrate cross-sectional views of stages in a method of forming a semiconductor device according to an example embodiment. In an example embodiment, the method of forming the semiconductor device may include a dual damascene process.

Figure 9:
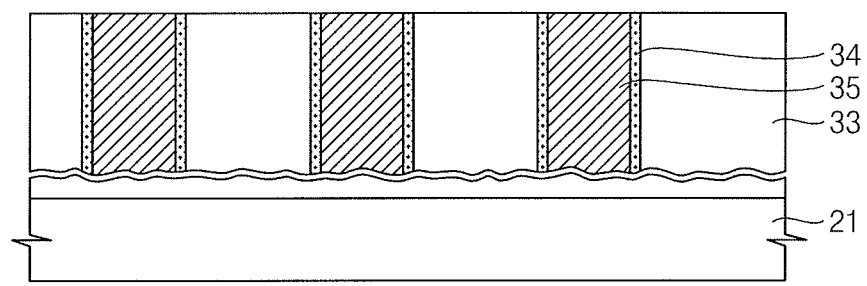
FIGS. 9 to 31 illustrate cross-sectional views of stages in a method of forming a semiconductor device according to example embodiments.

Referring to FIG. 9, a lower insulating layer 33, a first barrier metal layer 34, and a plurality of conductive patterns 35 may be formed on a substrate 21. Each of the plurality of conductive patterns 35 may correspond to a lower interconnection or a lower via plug. Each of the plurality of conductive patterns 35 may correspond to a redistribution layer (RDL) or a redistribution plug. A plurality of active/passive elements may be formed in or on the substrate 21. Each of the plurality of conductive patterns 35 may be connected to one selected from among the plurality of active/passive elements.

The substrate 21 may include a semiconductor substrate such as a silicon wafer or a silicon-on-insulator (SOI) wafer. The lower insulating layer 33 may cover the substrate 21. The lower insulating layer 33 may include an insulating material such as silicon oxide, silicon nitride, silicon oxynitride, silicon oxycarbonitride (SiOCN), a low-k dielectric material, a high-k dielectric material, or a combination thereof. In an example embodiment, the lower insulating layer 33 may include a low-k dielectric material such as SiOCH.

The first barrier metal layer 34 and the plurality of conductive patterns 35 may be formed in the lower insulating layer 33. The formation of the first barrier metal layer 34 and the plurality of conductive patterns 35 may include a thin-film forming process and a planarization process. The planarization process may include a chemical mechanical polishing (CMP) process, an etch-back process, or a combination thereof. Top surfaces of the lower insulating layer 33, the first barrier metal layer 34, and the plurality of conductive patterns 35 may be exposed at substantially the same planar surface. Each of the plurality of conductive patterns 35 may be surrounded by the first barrier metal layer 34. The first barrier metal layer 34 may include titanium (Ti), titanium nitride (TiN), tantalum (Ta), tantalum nitride (TaN), manganese (Mn), manganese oxide (MnO), manganese nitride (MnN), ruthenium (Ru), ruthenium oxide (RuO), ruthenium nitride (RuN), or a combination thereof. The plurality of conductive patterns 35 may include a conductive material such as a metal, a metal oxide, a metal nitride, a metal silicide, polysilicon (poly-Si), conductive carbon, or a combination thereof. For example, the plurality of conductive patterns 35 may include copper (Cu), ruthenium (Ru), ruthenium oxide (RuO), ruthenium nitride (RuN), cobalt (Co), tungsten (W), tungsten nitride (WN), titanium (Ti), titanium nitride (TiN), tantalum (Ta), tantalum nitride (TaN), manganese (Mn), manganese oxide (MnO), manganese nitride (MnN), or a combination thereof. In an example embodiment, the plurality of conductive patterns 35 may include a copper (Cu) layer formed using an electroplating process.

Figure 10:
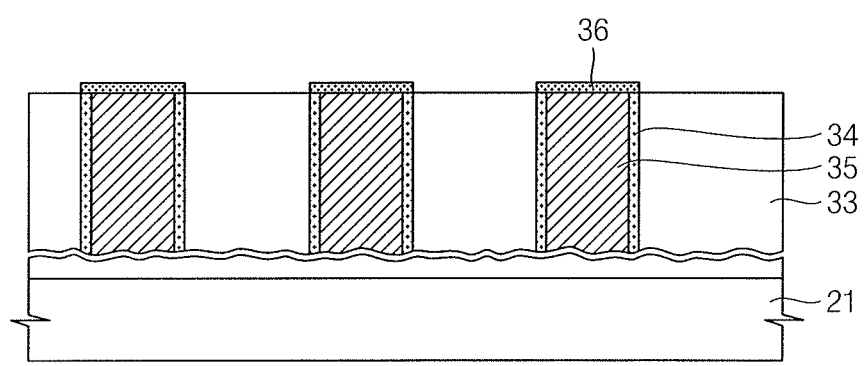

Referring to FIG. 10, a capping layer 36 may be formed on the plurality of conductive patterns 35. A selective deposition process may be applied to the formation of the capping layer 36. The capping layer 36 may cover the plurality of conductive patterns 35 and the first barrier metal layer 34. The capping layer 36 may include a conductive material such as cobalt (Co), cobalt tungsten (CoW), cobalt tungsten phosphide (CoWP), cobalt ruthenium nitride (CoRuN), ruthenium (Ru), carbon-based graphene, or a combination thereof. In an example embodiment, the capping layer 36 may include a cobalt (Co) layer having a thickness of about 5 nm.

Figure 11:
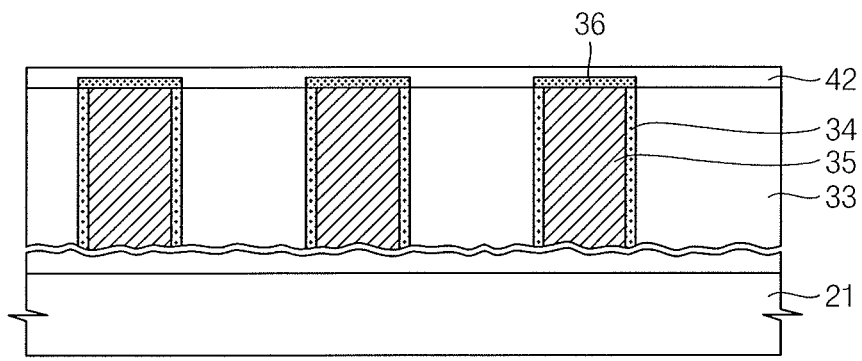

Referring to FIG. 11, an etch stop layer 42 may be formed to cover the capping layer 36, the plurality of conductive patterns 35, the first barrier metal layer 34, and the lower insulating layer 33. The process of forming the etch stop layer 42 may include a chemical vapor deposition (CVD) process, a cyclic CVD process, an atomic layer deposition (ALD) process, or a combination thereof.

Figure 12:
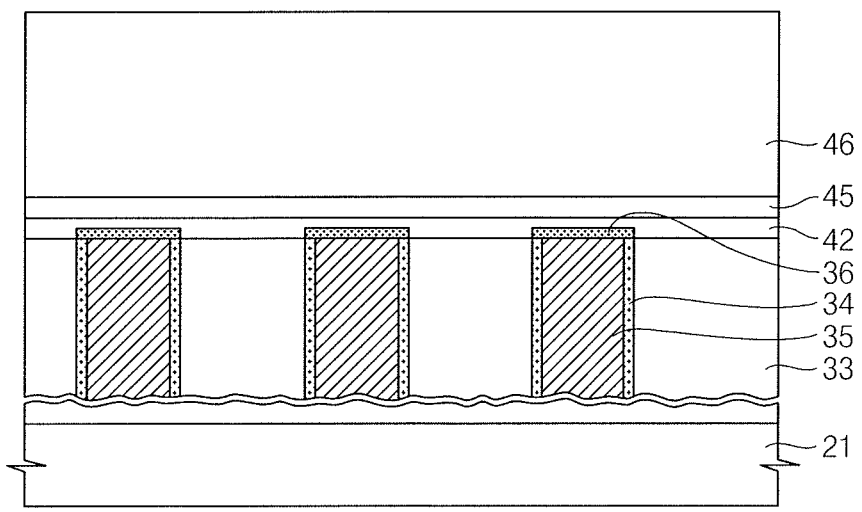

Referring to FIG. 12, a glue layer 45 and a middle insulating layer 46 may be formed on the etch stop layer 42. The glue layer 45 may be formed between the etch stop layer 42 and the middle insulating layer 46. The middle insulating layer 46 may be formed to have a thickness of 20 nm to 100 nm. In an example embodiment, the middle insulating layer 46 may be formed to have a thickness of about 50 nm. The glue layer 45 may have a smaller thickness than the middle insulating layer 46. In an implementation, the glue layer 45 may be omitted. The etch stop layer 42 may include a material having an etch selectivity with respect to the glue layer 45 and the middle insulating layer 46. The glue layer 45 may include a material having an etch selectivity with respect to the middle insulating layer 46. The middle insulating layer 46 may include a low-k dielectric material.

In an example embodiment, the middle insulating layer 46 may include a SiOCH layer formed using a FCVD process. The glue layer 45 may include SiOCH, SiOH, or a combination of components thereof. The glue layer 45 may have higher "O" content and lower "C" content than the middle insulating layer 46. The glue layer 45 and the middle insulating layer 46 may be formed using an in-situ process. The glue layer 45 may have a lower etch rate than the middle insulating layer 46. The glue layer 45 may have a higher hardness than the middle insulating layer 46. The glue layer 45 may have a lower porosity than the middle insulating layer 46. The etch stop layer 42 may include silicon nitride (SiN), silicon carbonitride (SiCN), silicon oxycarbonitride (SiOCN), silicon oxynitride (SiON), aluminum nitride (AlN), aluminum oxide (AlO), aluminum oxycarbide (AlOC), or a combination thereof.

In an example embodiment, the middle insulating layer 46 may include a $SiO_xC_yH$ layer. The glue layer 45 may include a $SiO_mC_nH$ layer. Here, x, y, m, and n may be in relationships of $x>0$, $y>0$, $m>0$, $n\geq 0$, $x<m$, and $y>n$.

Figure 13:
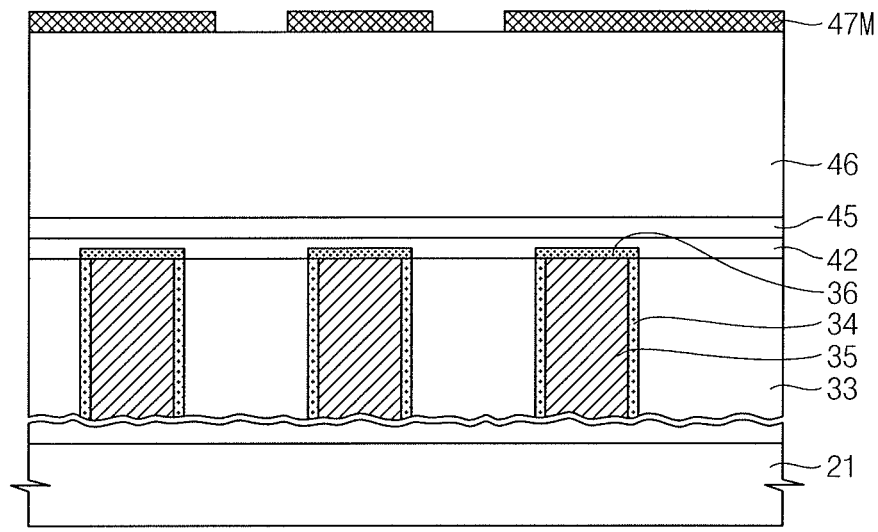

Referring to FIG. 13, a first mask pattern 47M may be formed on the middle insulating layer 46. The first mask pattern 47M may include a photoresist pattern, a hard mask pattern, or a combination thereof. In an example embodiment, the first mask pattern 47M may include silicon oxynitride (SiON), titanium oxide (TiO), aluminum oxide (AlO), or a combination thereof.

Figure 14:
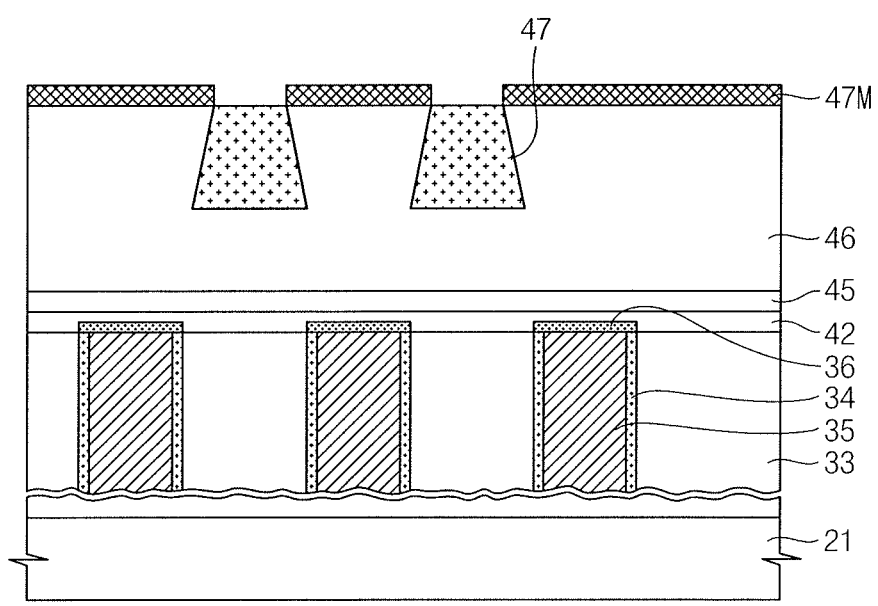

Referring to FIG. 14, a plurality of via control regions 47 may be formed in the middle insulating layer 46. The formation of the plurality of via control regions 47 may include a selective densification process. The selective densification process for forming the plurality of via control regions 47 may include an $O_2$ ashing process, an ultraviolet (UV) irradiation process, or a combination thereof. For example, during the selective densification process, the middle insulating layer 46 may be partially exposed to $O_2$ plasma due to the first mask pattern 47M. The $O_2$ plasma may be controlled by various types of bias power.

The plurality of via control regions 47 may include SiOCH, SiOH, or a combination of components thereof. The plurality of via control regions 47 may have higher "O" content and lower "C" content than the middle insulating layer 46. The plurality of via control regions 47 may have an etch selectivity with respect to the middle insulating layer 46. The plurality of via control regions 47 may have a lower etch rate than the middle insulating layer 46. The plurality of via control regions 47 may have a higher hardness than the middle insulating layer 46. The plurality of via control regions 47 may have a lower porosity than the middle insulating layer 46.

In an example embodiment, the middle insulating layer 46 may include a $SiO_xC_yH$ layer. The plurality of via control regions 47 may include a $SiO_mC_nH$ layer. Here, x, y, m, and n may be in relationships of $x>0$, $y>0$, $m>0$, $n\geq 0$, $x<m$, and $y>n$.

Each of the plurality of via control regions 47 may be formed to have various profiles. In an example embodiment, each of the plurality of via control regions 47 may have a trapezoidal shape, an elliptical shape, or a jar shape. The plurality of via control regions 47 may be formed to have a thickness of 20 nm to 100 nm. In an example embodiment, the plurality of via control regions 47 may be formed to a thickness of about 50 nm. The plurality of via control regions 47 may be arranged between the plurality of conductive patterns 35.

The plurality of via control regions 47 may be formed to be spaced apart from each other in the middle insulating layer 46. In an example embodiment, the plurality of via control regions 47 may be connected to each other in the middle insulating layer 46.

Figure 15:
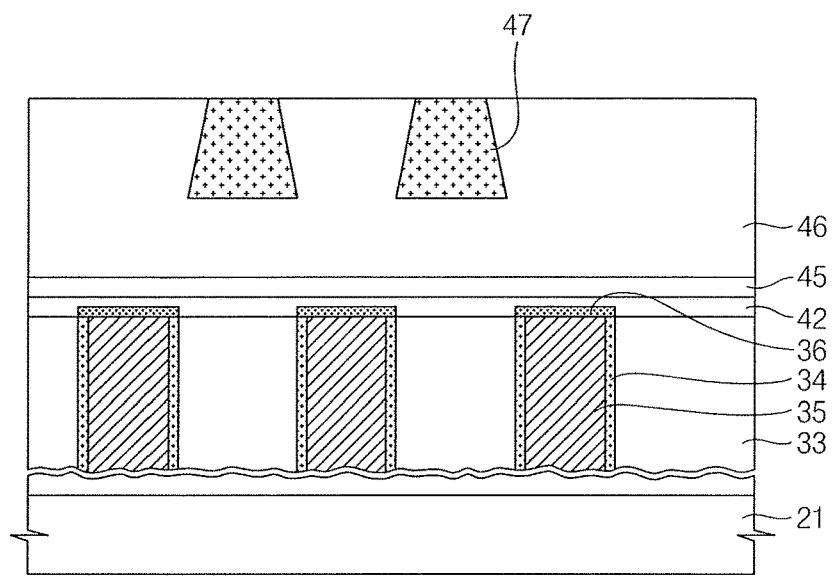

Referring to FIG. 15, the first mask pattern 47M may be removed to expose the middle insulating layer 46 and the plurality of via control regions 47. UV irradiation may be performed on the middle insulating layer 46 and the plurality of via control regions 47.

Figure 16:
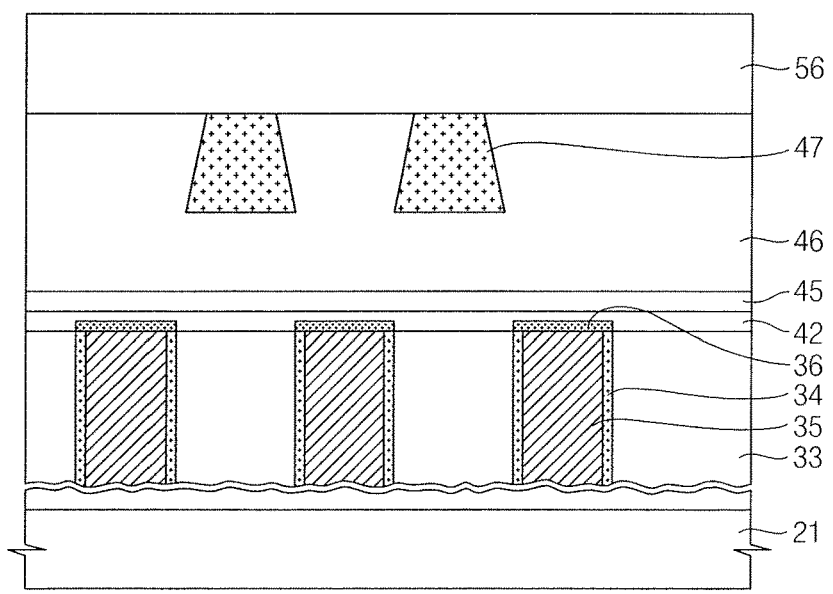

Referring to FIG. 16, an upper insulating layer 56 may be formed on the middle insulating layer 46 and the plurality of via control regions 47. The upper insulating layer 56 may include a low-k dielectric material. The upper insulating layer 56 may be formed using an FCVD process, a plasma-enhanced CVD (PECVD) process, an ALD process, or a combination thereof. The upper insulating layer 56 may be formed to a thickness of 20 nm to 100 nm. In an example embodiment, the upper insulating layer 56 may be formed to have a thickness of about 50 nm.

The upper insulating layer 56 may include a material having an etch selectivity with respect to the plurality of via control regions 47. The upper insulating layer 56 may have a higher etch rate than the plurality of via control regions 47. In an example embodiment, the upper insulating layer 56 may include a SiOCH layer.

Figure 17:
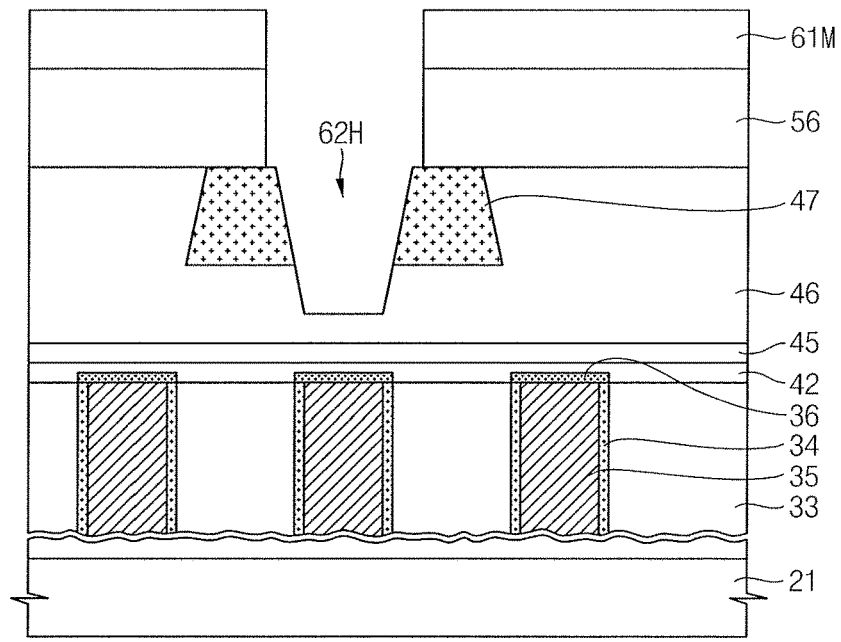

Referring to FIG. 17, a second mask pattern 61M may be formed on the upper insulating layer 56. A via hole 62H may be formed using the second mask pattern 61M as an etch mask to completely pass through the upper insulating layer 56, pass through a portion between the plurality of via control regions 47, and partially pass through the middle insulating layer 46. An alignment margin of the second mask pattern 61M may be enhanced by an etch selectivity between the plurality of via control regions 47 and the middle insulating layer 46. The formation of the via hole 62H may include an anisotropic etching process.

Figure 18:
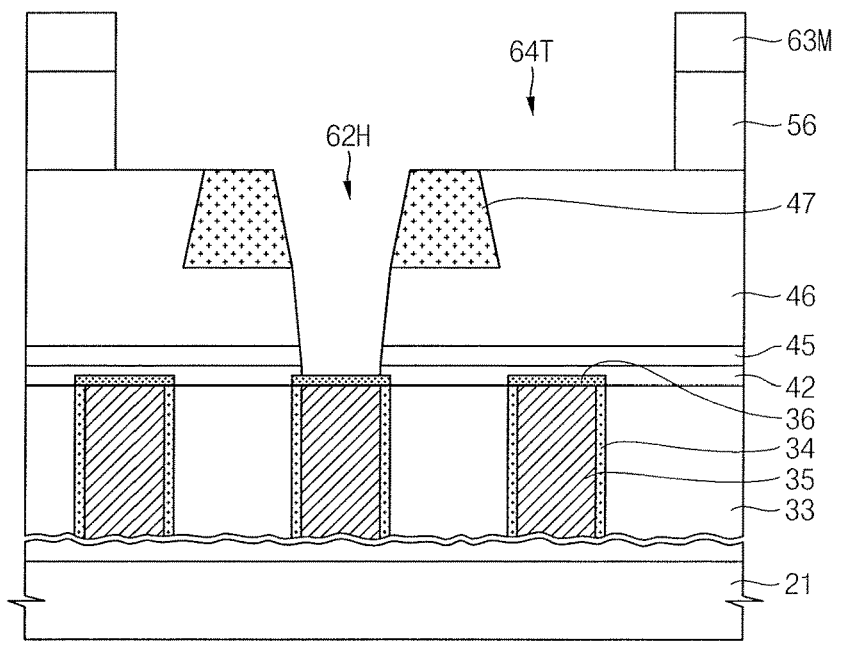

Referring to FIG. 18, the second mask pattern 61M may be removed, and a third mask pattern 63M may be formed on the upper insulating layer 56. A trench 64T may be formed in the upper insulating layer 56 using the third mask pattern 63M as an etch mask. The formation of the trench 64T may include an anisotropic etching process. During the formation of the trench 64T in the upper insulating layer 56, the via hole 62H may expand downward. The via hole 62H may pass through the portion between the plurality of via control regions 47, completely pass through the middle insulating layer 46, pass through the glue layer 45, and pass through the etch stop layer 42. The capping layer 36 may be exposed at a bottom surface of the via hole 62H. The via hole 62H may communicate with a bottom surface of the trench 64T.

A shape of the via hole 62H may be formed by an etch selectivity between the plurality of via control regions 47 and the middle insulating layer 46. The plurality of via control regions 47 may serve to control a profile of the via hole 62H. The plurality of via control regions 47 may serve to reduce an alignment error of the via hole 62H. The plurality of via control regions 47 may help to prevent a specific region of the via hole 62H from abnormally expanding. For example, the plurality of via control regions 47 may serve to prevent an upper region of the via hole 62H from abnormally expanding.

Figure 19:
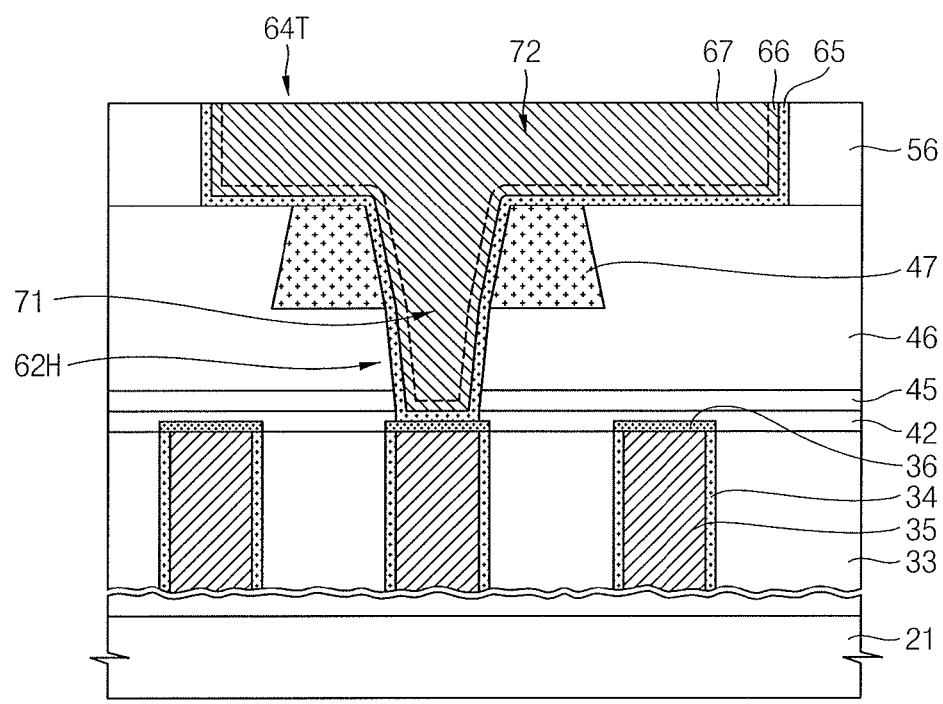

Referring to FIG. 19, the third mask pattern 63M may be removed. A second barrier metal layer 65, a seed layer 66, and an upper conductive layer 67 may be formed inside the via hole 62H and the trench 64T. The second barrier metal layer 65, the seed layer 66, and the upper conductive layer 67 may constitute a via plug 71 inside the via hole 62H and constitute an upper interconnection 72 inside the trench 64T. The second barrier metal layer 65 may be formed to surround a side surface and a bottom surface of the upper conductive layer 67. The seed layer 66 may be interposed between the second barrier metal layer 65 and the upper conductive layer 67. The formation of the via plug 71 and the upper interconnection 72 may include a thin-film forming process and a planarization process. Top surfaces of the upper insulating layer 56, the second barrier metal layer 65, the seed layer 66, and the upper conductive layer 67 may be exposed at substantially the same planar surface.

The second barrier metal layer 65 may include Ti, TiN, Ta, TaN, Mn, MnO, MnN, Ru, RuO, RuN, or a combination thereof. The seed layer 66 and the upper conductive layer 67 may include a conductive material such as a metal, a metal oxide, a metal nitride, a metal silicide, poly-Si, conductive carbon, or a combination thereof. For example, the seed layer 66 and the upper conductive layer 67 may include Cu, Ru, RuO, RuN, Co, W, WN, Ti, TiN, Ta, TaN, Mn, MnO, MnN, or a combination thereof. In an example embodiment, the seed layer 66 may include a copper (Cu) layer formed using a CVD process or a physical vapor deposition (PVD) process. The upper conductive layer 67 may include a copper (Cu) layer formed using an electroplating process.

In an example embodiment, a liner may be formed between the second barrier metal layer 65 and the seed layer 66. The liner may include Mn, Co, Ru, or a combination thereof.

FIGS. 20 to 27 are cross-sectional views for describing a method of forming a semiconductor device according to an example embodiment.

Figure 20:
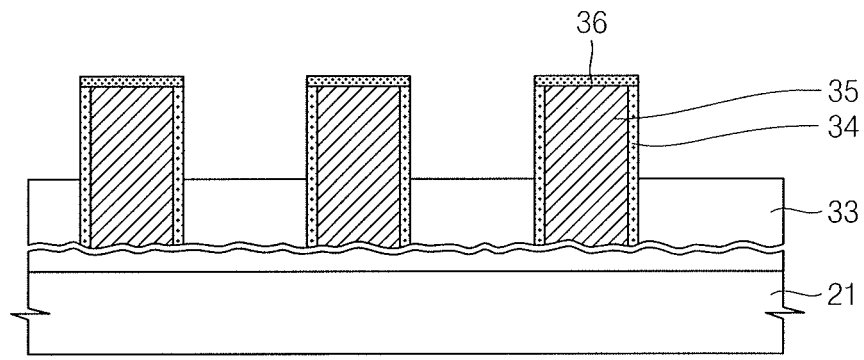

Referring to FIG. 20, a lower insulating layer 33, a first barrier metal layer 34, a plurality of conductive patterns 35, and a capping layer 36 may be formed on a substrate 21. The lower insulating layer 33 may be recessed to a lower level than top ends of the first barrier metal layer 34 and the plurality of conductive patterns 35. The first barrier metal layer 34 and the plurality of conductive patterns 35 may protrude to a higher level than a top surface of the lower insulating layer 33. The capping layer 36 may cover top surfaces of the first barrier metal layer 34 and the plurality of conductive patterns 35.

Figure 21:
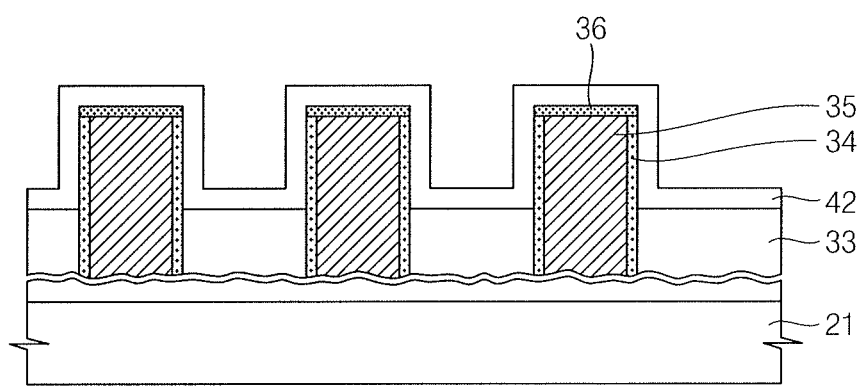

Referring to FIG. 21, an etch stop layer 42 may be formed on the lower insulating layer 33, the first barrier metal layer 34, the plurality of conductive patterns 35, and the capping layer 36. The etch stop layer 42 may be conformally formed along exposed surfaces of the lower insulating layer 33, the first barrier metal layer 34, and the capping layer 36.

Figure 22:
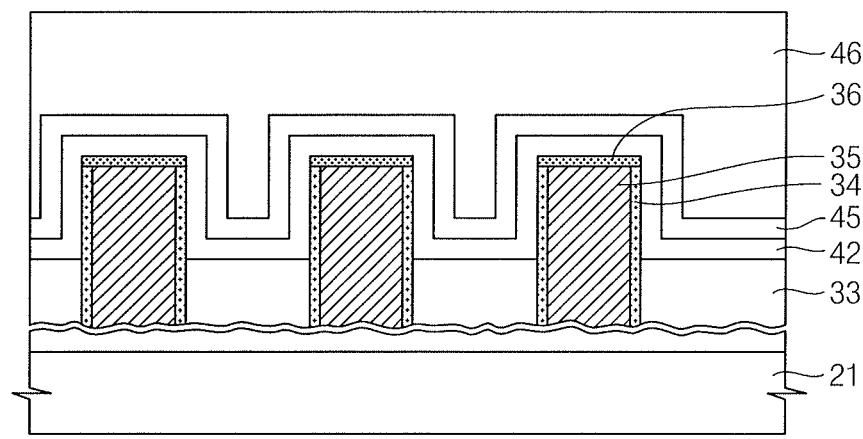

Referring to FIG. 22, a glue layer 45 and a middle insulating layer 46 may be formed on the etch stop layer 42. The glue layer 45 may conformally cover a surface of the etch stop layer 42. The middle insulating layer 46 may be thicker than the glue layer 45.

Figure 23:
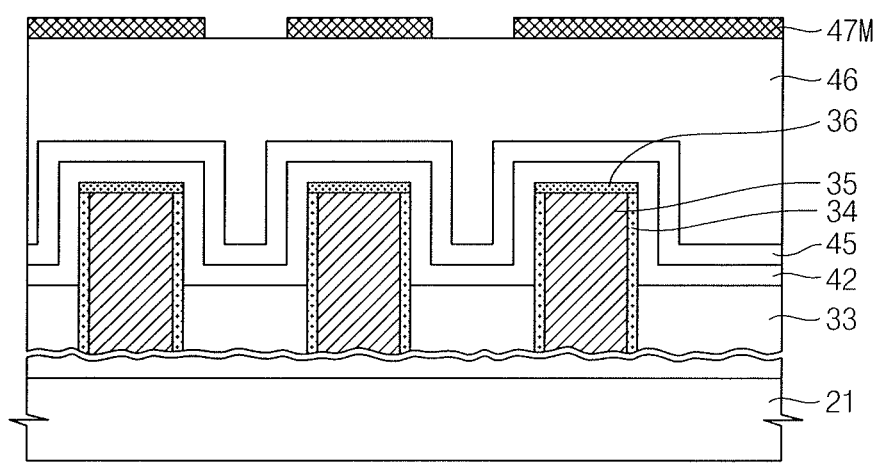

Referring to FIG. 23, a first mask pattern 47M may be formed on the middle insulating layer 46.

Figure 24:
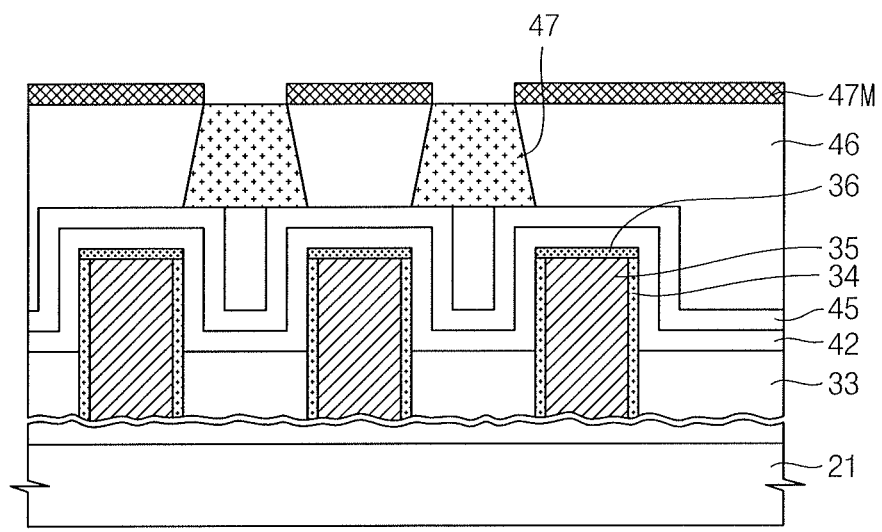

Referring to FIG. 24, a plurality of via control regions 47 may be formed in the middle insulating layer 46.

Figure 25:
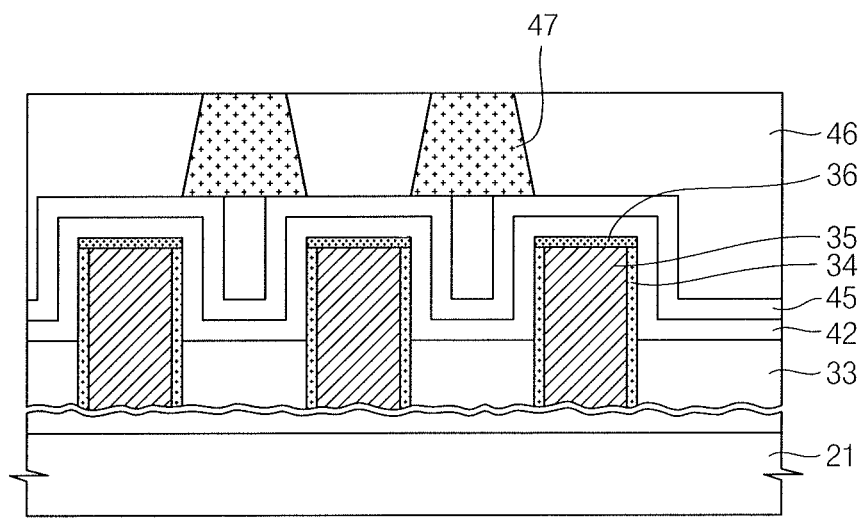

Referring to FIG. 25, the first mask pattern 47M may be removed to expose the middle insulating layer 46 and the plurality of via control regions 47.

Figure 26:
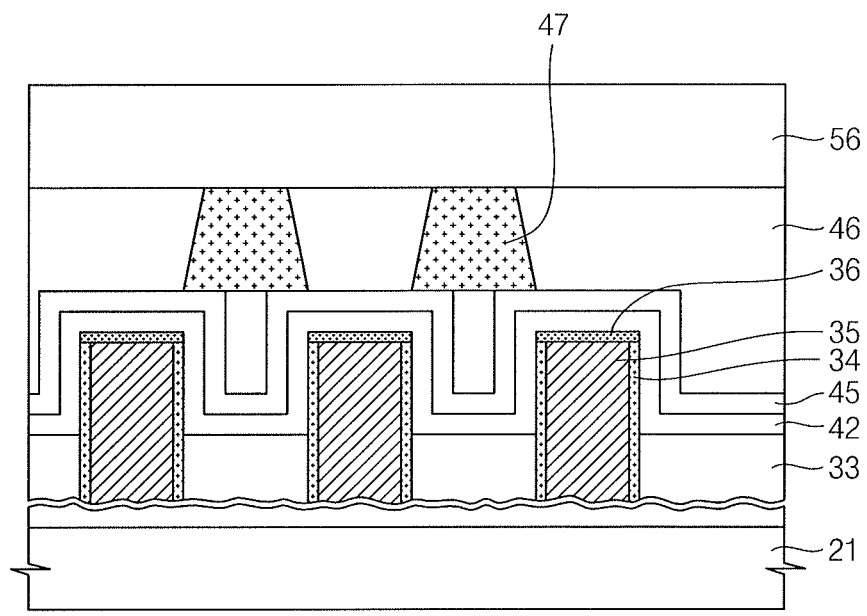

Referring to FIG. 26, an upper insulating layer 56 may be formed on the middle insulating layer 46 and the plurality of via control regions 47.

Figure 27:
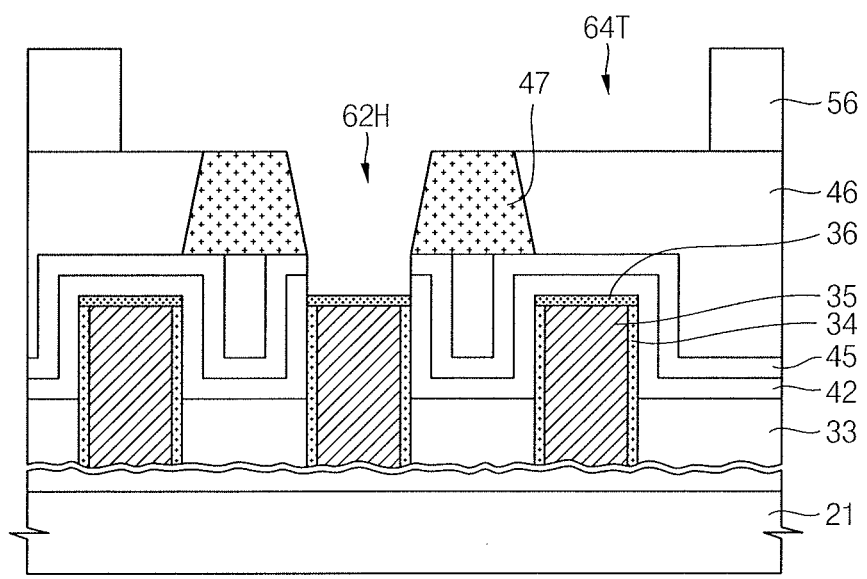

Referring to FIG. 27, a trench 64T and a via hole 6214 may be formed. The trench 64T may be formed in the upper insulating layer 56. The via hole 62H may communicate with a bottom surface of the trench 64T. The via hole 62H may pass through a portion between the plurality of via control regions 47, completely pass through the middle insulating layer 46, pass through the glue layer 45, and pass through the etch stop layer 42. The capping layer 36 may be exposed at a bottom surface of the via hole 6214.

Referring back to FIG. 3, a second barrier metal layer 65, a seed layer 66, and an upper conductive layer 67 may be formed inside the via hole 62H and the trench 64T. The second barrier metal layer 65, the seed layer 66, and the upper conductive layer 67 may constitute the via plug 71 inside the via hole 62H and constitute the upper interconnection 72 inside the trench 64T.

Figure 28:
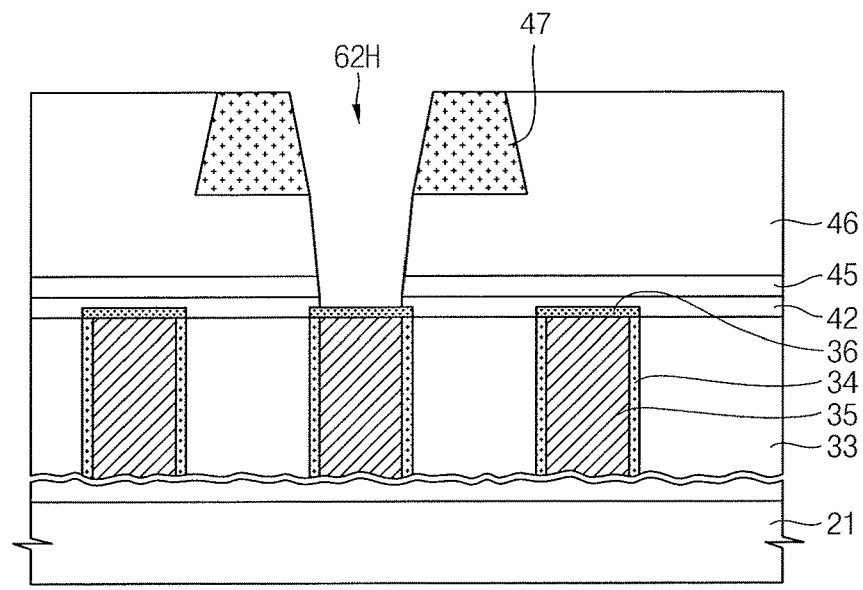
Figure 29:
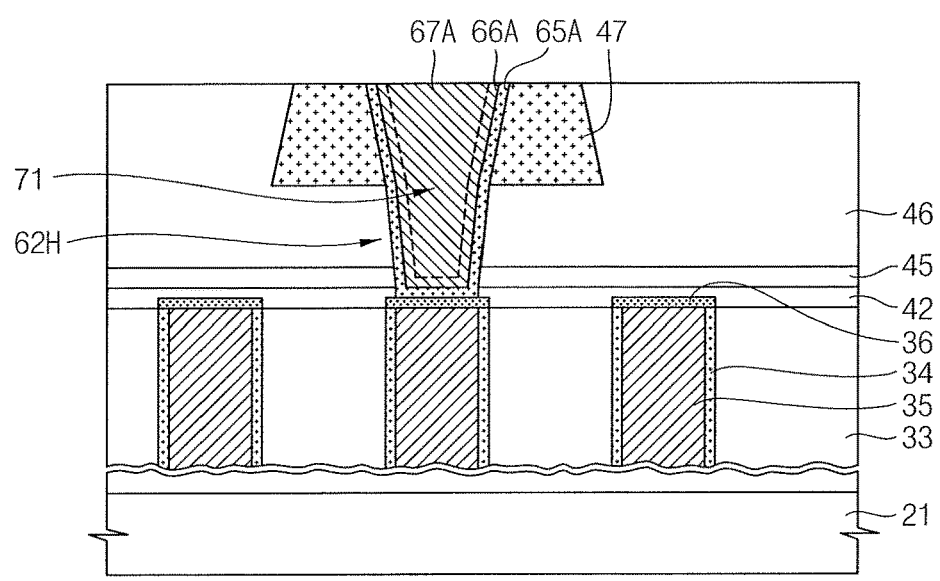
Figure 30:
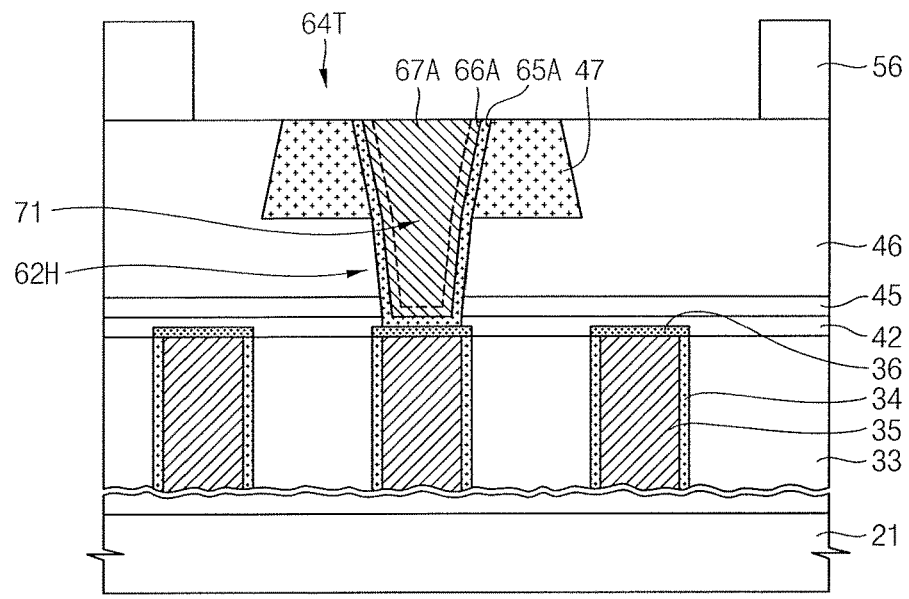

FIGS. 28 to 30 illustrate cross-sectional views of stages in a method of forming a semiconductor device according to an example embodiment. In an example embodiment, the method of forming the semiconductor device may include a single damascene process.

Referring to FIG. 28, a lower insulating layer 33, a first barrier metal layer 34, a plurality of conductive patterns 35, a capping layer 36, an etch stop layer 42, a glue layer 45, a middle insulating layer 46, a plurality of via control regions 47, and a via hole 62H may be formed on a substrate 21. The via hole 62H may pass through a portion between the plurality of via control regions 47, completely pass through the middle insulating layer 46, pass through the glue layer 45, and pass through the etch stop layer 42. The capping layer 36 may be exposed at a bottom surface of the via hole 62H.

Referring to FIG. 29, a via barrier metal layer 65A, a via seed layer 66A, and a via conductive layer 67A may be formed inside the via hole 62H. The via barrier metal layer 65A, the via seed layer 66A, and the via conductive layer 67A may constitute a via plug 71. Top surfaces of the via plug 71, the plurality of via control regions 47, and the middle insulating layer 46 may be exposed at substantially the same planar surface.

Referring to FIG. 30, an upper insulating layer 56 may be formed on the middle insulating layer 46, the plurality of via control regions 47, and the via plug 71. A trench 64T may be formed in the upper insulating layer 56. The middle insulating layer 46, the plurality of via control regions 47, and the via plug 71 may be exposed at a bottom surface of the trench 64T.

Referring back to FIG. 5, an upper barrier metal layer 65B, an upper seed layer 66B, and an upper conductive layer 67B may be formed inside the trench 64T. The upper barrier metal layer 65B, the upper seed layer 66B, and the upper conductive layer 67B may constitute the upper interconnection 72. The upper interconnection 72 may be in contact with the via plug 71. The upper barrier metal layer 65B may be in direct contact with a top surface of the via plug 71.

The via barrier metal layer 65A and the upper barrier metal layer 65B may include Ti, TiN, Ta, TaN, Mn, MnO, MnN, Ru, RuO, RuN, or a combination thereof. The via seed layer 66A, the upper seed layer 66B, the via conductive layer 67A, and the upper conductive layer 67B may include a conductive material such as a metal, a metal oxide, a metal nitride, a metal silicide, poly-Si, conductive carbon, or a combination thereof. For example, the via seed layer 66A, the upper seed layer 66B, the via conductive layer 67A, and the upper conductive layer 67B may include Cu, Ru, RuO, RuN, Co, W, WN, Ti, TiN, Ta, TaN, Mn, MnO, MnN, or a combination thereof. In an example embodiment, the via seed layer 66A and the upper seed layer 66B may include a copper (Cu) layer formed using a CVD process or a PVD process. The via conductive layer 67A and the upper conductive layer 67B may include a copper (Cu) layer formed using an electroplating process.

In an example embodiment, a liner may be further formed between the via barrier metal layer 65A and the via seed layer 66A and between the upper barrier metal layer 65B and the upper seed layer 66B. The liner may include Mn, Co, Ru, or a combination thereof.

Figure 31:
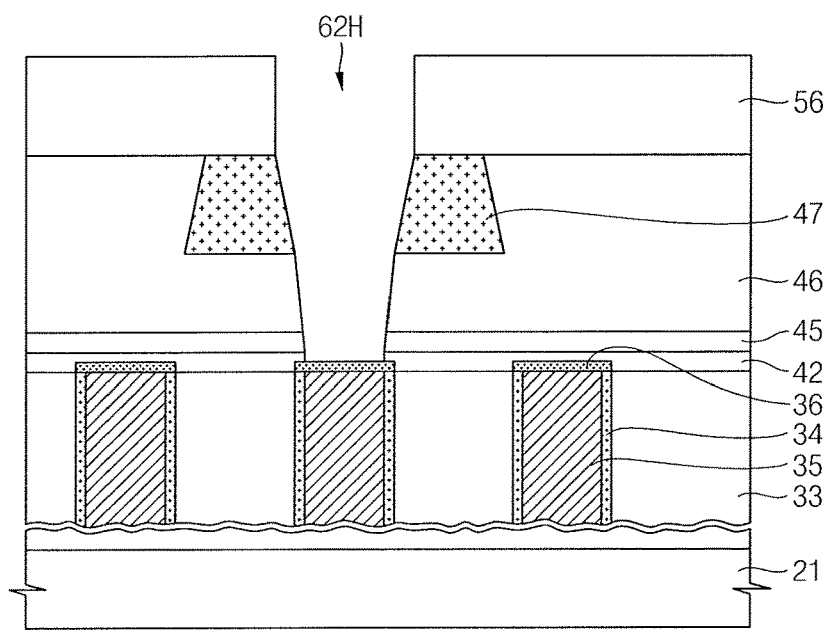

FIG. 31 is a cross-sectional view illustrating a method of forming a semiconductor device according to an example embodiment.

Referring to FIG. 31, a lower insulating layer 33, a first barrier metal layer 34, a plurality of conductive patterns 35, a capping layer 36, an etch stop layer 42, a glue layer 45, a middle insulating layer 46, a plurality of via control regions 47, an upper insulating layer 56, and a via hole 62H may be formed on a substrate 21. The via hole 62H may pass through the upper insulating layer 56, pass through a portion between the plurality of via control regions 47, completely pass through the middle insulating layer 46, pass through the glue layer 45, and pass through the etch stop layer 42. The capping layer 36 may be exposed at a bottom surface of the via hole 62H.

Referring back to FIG. 6, a second barrier metal layer 65, a seed layer 66, and an upper conductive layer 67 may be formed inside the via hole 62H. The second barrier metal layer 65, the seed layer 66, and the upper conductive layer 67 may constitute the via plug 71. Top surfaces of the via plug 71 and the upper insulating layer 56 may be exposed at substantially the same planar surface.

By way of summation and review, an upper interconnection layer may be connected to a lower interconnection layer through a via plug. A structure of the via plug and a method of forming the via plug may significantly affect mass-production efficiency and reliability of the semiconductor device.

As described above, embodiments are directed to providing a semiconductor device having a via plug that may provide advantages in improving mass-production efficiency and reliability.

In addition, embodiments are directed to providing a method of forming a semiconductor device having a via plug that may provide advantages in improving mass-production efficiency and reliability.

According to the example embodiments, a plurality of via control regions may be provided in a middle insulating layer. The plurality of via control regions may be formed using a selective densification process. A via hole may be formed to pass through a portion between the plurality of via control regions. A via plug may be formed inside the via hole. The plurality of via control regions may control a shape of the via hole.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower insulating layer on a substrate;
a conductive pattern in the lower insulating layer;
a middle insulating layer on the lower insulating layer and the conductive pattern;
a via control region in the middle insulating layer, the via control region having a lower etch rate than the middle insulating layer;
an upper insulating layer on the middle insulating layer and the via control region; and
a via plug passing through the via control region and connected to the conductive pattern.

2. The semiconductor device as claimed in claim 1, wherein top surfaces of the via control region and the middle insulating layer are substantially coplanar.

3. The semiconductor device as claimed in claim 1, wherein:
the middle insulating layer includes a low-k dielectric material; and
the via control region has a lower porosity than the middle insulating layer.

4. The semiconductor device as claimed in claim 1, wherein:
the middle insulating layer includes a $SiO_xC_yH$ layer; and
the via control region includes a $SiO_mC_nH$ layer,
wherein $x>0$, $y>0$, $m>0$, $n\geq 0$, $x<m$, and $y>n$.

5. The semiconductor device as claimed in claim 1, wherein a bottom surface of the via control region is at a higher level than a bottom surface of the middle insulating layer.

6. The semiconductor device as claimed in claim 5, wherein the bottom surface of the via control region is in contact with the middle insulating layer.

7. The semiconductor device as claimed in claim 1, wherein bottom surfaces of the via control region and the middle insulating layer are substantially coplanar.

8. The semiconductor device as claimed in claim 1, wherein:
a top surface of the lower insulating layer is at a lower level than a top end of the conductive pattern; and a bottom end of the middle insulating layer is at a lower level than the top end of the conductive pattern.

9. The semiconductor device as claimed in claim 1, further comprising a glue layer between the lower insulating layer and the middle insulating layer, wherein:
the via plug passes through the glue layer;
the middle insulating layer includes a $SiO_xC_yH$ layer; and
the glue layer includes a $SiO_mC_nH$ layer,
wherein $x>0$, $y>0$, $m>0$, $n\geq 0$, $x<m$, and $y>n$.

10. The semiconductor device as claimed in claim 9, wherein the middle insulating layer is interposed between the via control region and the glue layer.

11. The semiconductor device as claimed in claim 9, wherein a side surface of the via plug is in contact with the via control region, the middle insulating layer, and the glue layer.

12. The semiconductor device as claimed in claim 9, wherein a bottom surface of the via control region is in contact with the glue layer.

13. The semiconductor device as claimed in claim 12, wherein a side surface of the via plug is in contact with the via control region and the glue layer.

14. The semiconductor device as claimed in claim 9, wherein the glue layer is thinner than the middle insulating layer.

15. The semiconductor device as claimed in claim 9, wherein the via control region is thicker than the glue layer.

16. The semiconductor device as claimed in claim 9, further comprising an etch stop layer between the lower insulating layer and the glue layer, the etch stop layer having an etch selectivity with respect to the middle insulating layer and the glue layer.

17. The semiconductor device as claimed in claim 16, wherein a side surface of the via plug is in contact with the via control region, the middle insulating layer, the glue layer, and the etch stop layer.

18. A semiconductor device, comprising:
a lower insulating layer on a substrate;
a plurality of conductive patterns in the lower insulating layer;
a middle insulating layer on the lower insulating layer and the conductive patterns;
a plurality of via control regions in the middle insulating layer, the via control regions being arranged between the plurality of conductive patterns, and the via control regions having a lower porosity than the middle insulating layer;
an upper insulating layer on the middle insulating layer and the via control regions; and
a via plug between the via control regions and connected to one selected from among the conductive patterns.

19. A semiconductor device, comprising:
a lower insulating layer on a substrate;
a conductive pattern in the lower insulating layer;
a middle insulating layer on the lower insulating layer and the conductive pattern;
a via control region formed in the middle insulating layer, the via control region including a material having a lower etch rate than the middle insulating layer;
an upper insulating layer on the middle insulating layer and the via control region;
a via plug passing through the via control region and connected to the conductive pattern; and
an upper interconnection in the upper insulating layer and connected to the via plug.

20. The semiconductor device as claimed in claim 19, wherein a top surface of the via control region is in contact with the upper interconnection.

* * * * *